United States Patent
Chiang et al.

(10) Patent No.: US 7,215,578 B2
(45) Date of Patent: May 8, 2007

(54) METHOD AND APPARATUS FOR DRIVING FLASH MEMORY

(75) Inventors: Chin-Yi Chiang, Taipei (TW); Chun-Hua Tseng, Taipei (TW)

(73) Assignee: Via Technology, Inc., Taipei (TW)

( * ) Notice: Subject to any disclaimer, the term of this patent is extended or adjusted under 35 U.S.C. 154(b) by 0 days.

(21) Appl. No.: 11/336,509

(22) Filed: Jan. 19, 2006

(65) Prior Publication Data
US 2006/0176741 A1 Aug. 10, 2006

(30) Foreign Application Priority Data
Jan. 19, 2005 (TW) .............................. 94101605 A

(51) Int. Cl.
*G11C 16/04* (2006.01)
(52) U.S. Cl. .......................... 365/185.33; 365/185.18; 365/185.22
(58) Field of Classification Search ........... 365/185.33, 365/185.18, 185.22, 185.23
See application file for complete search history.

(56) References Cited

U.S. PATENT DOCUMENTS

| | | | | |
|---|---|---|---|---|
| 5,798,961 A | * | 8/1998 | Heyden et al. | ............... 365/52 |
| 2005/0279839 A1 | * | 12/2005 | Kuo et al. | .................. 235/492 |
| 2006/0075395 A1 | * | 4/2006 | Lee et al. | .................... 717/168 |

* cited by examiner

*Primary Examiner*—Anh Phung
*Assistant Examiner*—Hien N Nguyen
(74) *Attorney, Agent, or Firm*—Thomas, Kayden, Horstemeyer & Risley

(57) ABSTRACT

A method for driving a flash memory and flash memory apparatus thereof are provided. The flash memory apparatus comprises a flash memory controller and a flash memory. At first, a voltage level of the parameter definition pin is detected by the flash memory controller to obtain the basic configuration of the flash memory when the flash memory controller is in a reset mode. Next, a fundamental access operation is performed on the flash memory by the flash memory controller according to the basic configuration. Then, a detail configuration is read from a specific data block of the flash memory. At last, the flash memory is driven according to the basic configuration and the detail configuration of the flash memory.

16 Claims, 2 Drawing Sheets

METHOD AND APPARATUS FOR DRIVING FLASH MEMORY

This application claims the benefit of Taiwan application Ser. No. 94101605, filed Jan. 19, 2005, the subject matter of which is incorporated herein by reference.

BACKGROUND OF THE INVENTION

1. Field of the Invention

The invention relates in general to driving a memory, and more particularly to a method and apparatus for driving a flash memory.

2. Description of the Related Art

Many electronic products are equipped with a flash memory apparatus to maintain the stored data after the power is switched off. For example, the digital camera or the personal digital assistant (PDA) utilizes the flash memory apparatus such as a memory card to store pictures or data.

FIG. 1 is a schematic diagram of a conventional flash memory apparatus. Flash memory apparatus 100 comprises a flash memory 120 and a flash memory controller 110. The flash memory 120 is used for storing a data signal Da. The flash memory controller 110 controls the transmission of the data data and data signal Da. For example, the flash memory controller 110 outputs the data signal Da to be stored in the flash memory 120 according to the data data; or the flash memory controller 110 reads the data signal Da from the flash memory 120, converts the data signal Da into the data data for output. The flash memory controller 110 controls the flash memory 120 to complete the access of the data signal Da according to a control signal Sc0. In order to drive the flash memory 120, the flash memory controller 110 has to write all of the access parameters of the flash memory 120 into the flash memory controller 110 in advance. The access parameters include the parameters of data bus, memory page size, actual memory capacity, data transmission rate, and so forth. Since the access parameters of the flash memory 120 are defined in the firmware disposed inside the flash memory controller 110, the programming codes of the firmware as well as the settings of the hardware need to be replaced or reset when a flash memory of the flash memory apparatus 100 is replaced. As a result, the flash memory supported by the flash memory controller 110 is subject to a limited variety, and the associated renewal and re-verification are time consuming and incur more cost in terms of research and development.

FIG. 2 is a schematic diagram of another conventional flash memory apparatus. Flash memory apparatus 200 comprises a flash memory controller 210, a flash memory 220 and a storage device 230. The flash memory 220 is used for storing a data signal Da1. The flash memory controller 210 controls the transmission of the data data1 and data signal Da1. For example, the flash memory controller 210 outputs the data signal Da1 to be stored in the flash memory 220 according to the data data1; or the flash memory controller 210 reads the data signal Da1 from the flash memory 220, converts the data signal Da1 into the data data1 for output. The flash memory controller 210 control flash memory 220 to complete the access of the data signal Da1 according to the control signal Sc1. To resolve the foregoing problems associated with the flash memory apparatus 100, the flash memory 200 is equipped with an extra storage device 230 in which an access parameter Pa of the flash memory 220 is stored. Despite the firmware and setting of the flash memory controller 210 do not need to be replaced or reset when replacing the flash memory 220, the installation of the storage device 230 incurs an increase in manufacturing cost.

SUMMARY OF THE INVENTION

It is therefore the object of the invention to provide a flash memory apparatus and a parameter access method for detecting and setting the flash memory. A basic configuration of the flash memory is defined according to a pin voltage level, and a detail configuration is then obtained from the controlled flash memory to complete the driving of the flash memory.

According to the object of the invention, a method of driving a flash memory is provided. The flash memory apparatus comprises a flash memory controller and a flash memory. At first, a voltage level of the parameter definition pins is detected by the flash memory controller to obtain the basic configuration of the flash memory when the flash memory controller is in RESET mode. Next, the flash memory is read by the flash memory controller according to the basic configuration. Then, a detail configuration is read from a specific data block of the flash memory. At last, the flash memory is driven the memory controller according to the basic configuration and the detail configuration of the flash memory.

According to an object of the invention, a flash memory apparatus. The flash memory apparatus comprises a flash memory and a flash memory controller. The flash memory controller is used for controlling the access of the flash memory. When the flash memory controller is in RESET mode, a basic configuration of the flash memory is defined according to a voltage level of the parameter definition pin. The flash memory controller fundamentally accesses the flash memory according to the basic configurations and receives a detail configuration of the flash memory from the flash memory. Afterwards, the flash memory controller drives the flash memory according to the basic configuration and the detail configuration.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
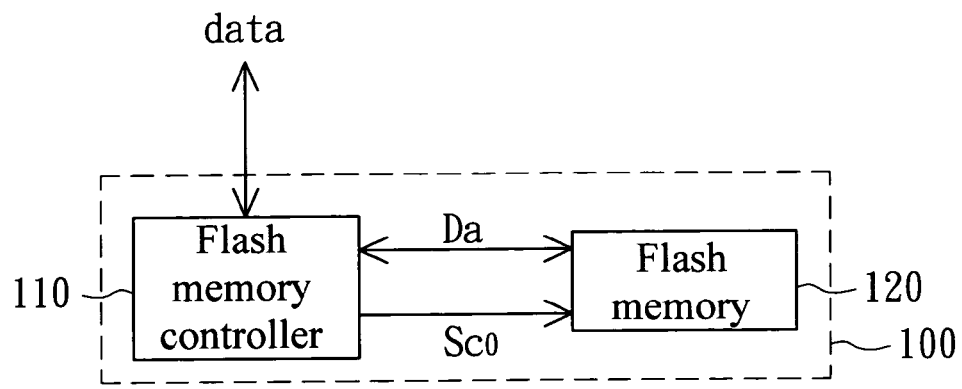
FIG. 1 is a schematic diagram of a conventional flash memory apparatus.
Figure 2:
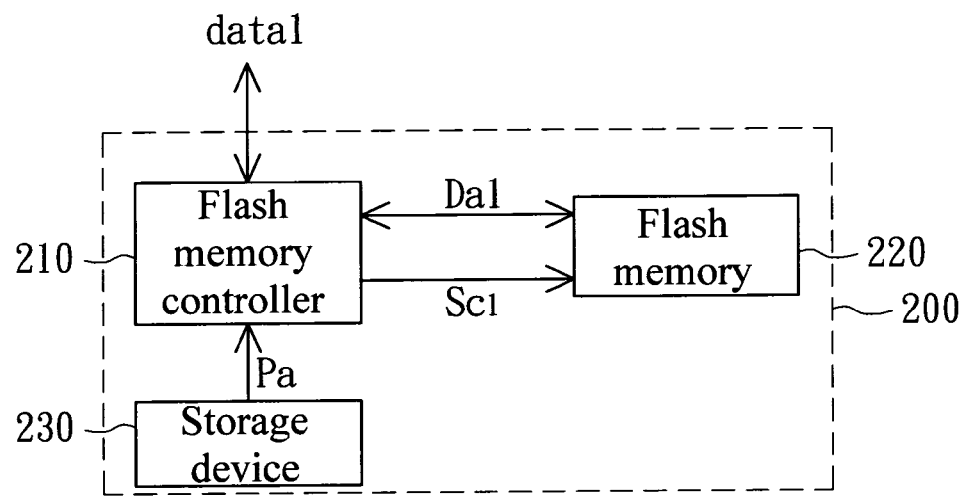
FIG. 2 is a schematic diagram of another conventional flash memory apparatus.
Figure 3:
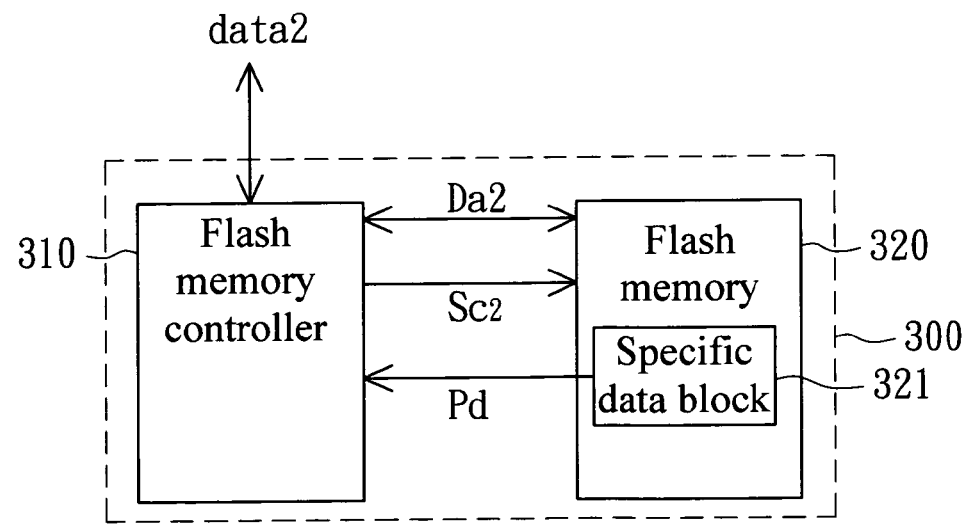
FIG. 3 is a schematic diagram of a flash memory apparatus according to a preferred embodiment of the invention.

Referring to FIG. 3, a schematic diagram of a flash memory apparatus according to a preferred embodiment of the invention is shown. The flash memory apparatus 300 comprises a flash memory controller 310 and a flash memory 320. The flash memory 320 is used for storing a data signal Da2, and the flash memory 320 has a specific data block 321 for storing a detail configuration Pd of the flash memory 320. The transmission of the data data2 and data signal Da2 is controlled by the flash memory controller 310. For example, the flash memory controller 310 outputs a data signal Da2 to be stored in the flash memory 320 according to the data data2; or the flash memory controller 310 reads the data signal Da2 from the flash memory 320, converts the data signal Da2 into the data data2 for output. The flash memory controller 310 controls the access of the flash memory 320 according to the control signal Sc2.

The flash memory controller 310 has a plurality of parameter definition pins. When the flash memory controller 310 is in a reset mode, the flash memory controller 310 detects the voltage level of the parameter definition pins to define a basic configuration of the flash memory 320, the basic configuration such as a parameter of data bus, a parameter of memory page size, a parameter of logic gate mode and a parameter of memory operating voltage. The parameter of data bus is used for determining the data bus of the flash memory 320 as 8 bits or 16 bits. The parameter of memory page size is used for determining the size of data unit as 512 Kb or 1024 Kb when the flash memory 320 accesses data. The parameter of logic gate mode is used for determining the logic gate mode of the flash memory 320 as an AND gate or NAND gate. The parameter of memory operating voltage is used for determining the operating voltage of the flash memory 320 as 1.8V or 3.3V.

The flash memory controller 310 performed a fundamental access operation on the flash memory 320 according to the basic configuration to receive the detail configuration Pd from the specific data block 321 of the flash memory 320. Meanwhile, the flash memory controller 310 controls the flash memory 320 according to the basic configuration only, so the flash memory 320 is not operating at the maximum accessing rate. Examples of the detail configuration include a parameter of actual memory capacity, a read cycle parameter and a write cycle parameter. The read cycle parameter is used for determining the read cycle of the flash memory 320. The write cycle parameter is used for determining the write cycle of the flash memory 320. The parameter of actual memory capacity is used for determining the actual capacity of the flash memory 320. Afterwards, the flash memory controller 310 completely drives the flash memory 320 according to the basic configuration and the detail configuration Pd for the flash memory 320 to operate at the maximum accessing rate.

Figure 4:
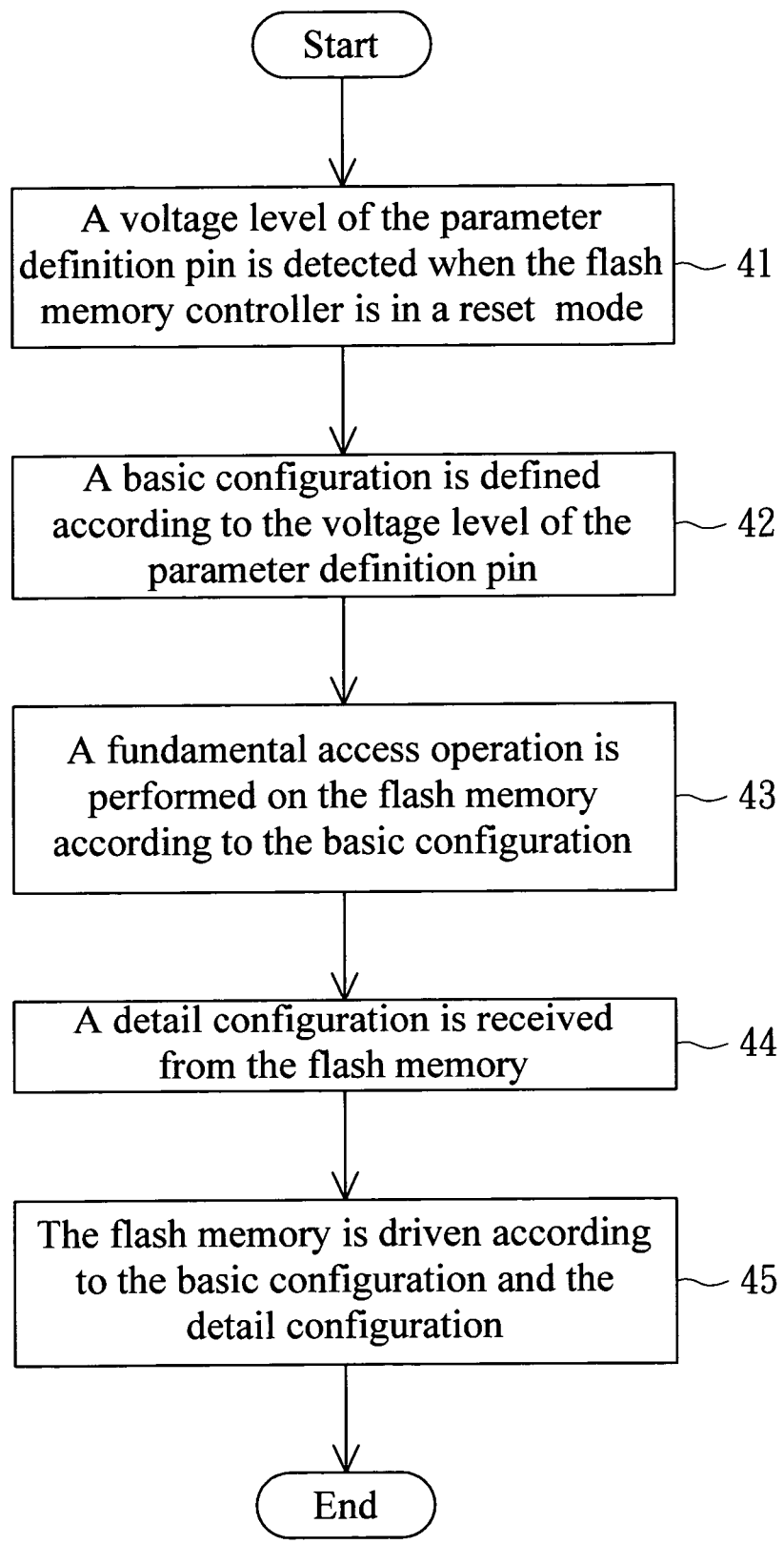
FIG. 4 is a flowchart of the method for detecting an access parameter of the flash memory apparatus according to a preferred embodiment of the invention.

Referring to FIG. 4, a flowchart of the method for detecting an access parameter of the flash memory apparatus according to a preferred embodiment of the invention is shown. The method for detecting the flash memory includes five steps. At first, the method begins at step 41, in which a voltage level of the parameter definition pin is detected when the flash memory controller 310 is in a reset mode. Next, proceed to step 42, a basic configuration is defined according to the voltage level of the parameter definition pin. Examples of the basic configuration include parameters of data bus, memory page size, logic gate mode and memory operating voltage. Then, proceed to step 43, a fundamental access operation is performed to the flash memory 320 according to the basic configuration. Afterwards, proceed to step 44, a detail configuration Pd is received from the flash memory 320. Examples of the detail configuration include a parameter of actual memory capacity, a read cycle parameter and a write cycle parameter. At last, as shown in step 45, the flash memory 300 is completely driven to reach the maximum accessing rate of operation according to the basic configuration and the detail configuration.

In the present embodiment, the voltage level of the parameter definition pin has no effect on the flash memory 320 when the flash memory controller 310 is in a reset stage, but can be used by the flash memory controller 310 to define the basic configuration of the flash memory 320 for performing an access operation on the flash memory 320. When signals are transmitted between the flash memory controller 310 and the flash memory 320, that is, the flash memory controller 310 is not in a reset mode, the parameter definition pins are used for transmitting data. For example, the flash memory controller 310 utilizes the parameter definition pin to output a control signal Sc2 to the flash memory 320. The parameter definition pins, disposed on a circuit board of the flash memory apparatus 300, and the voltage levels of the parameter definition pins in a reset mode are set by a pull-up resistor and a pull-down resistor. Examples of the parameter definition pin include parameter definition pins A to D for respectively defining the parameters of data bus, memory page size, logic gate mode and memory operating voltage.

The method and apparatus for driving a flash memory disclosed in above embodiment of the invention neither requires the firmware and setting of the flash memory controller to be replaced or reset when replacing the flash memory nor requires the installation of an extra storage device, thus avoiding the above-mentioned increase in time and cost due to the renewal and re-verification of the firmware and the installation of an extra storage device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for driving a memory, applied to a memory apparatus having a memory controller and a memory, and the method comprising:
   detecting a voltage level of a parameter definition pin of the memory controller by the memory controller when the memory apparatus is in a reset mode;
   defining a basic configuration of the memory by the memory controller according to the voltage level of the parameter definition pin;
   reading the memory by the memory controller according to the basic configuration; and
   receiving a detail configuration from the memory by the memory controller, wherein the memory controller drives the memory according to the basic configuration and the detail configuration.

2. The method according to claim 1, wherein the memory is a flash memory.

3. The method according to claim 1, wherein the memory comprises a specific data block used for storing the detail configuration of the memory.

4. The method according to claim 1, wherein the basic configuration comprises:
   a parameter of data bus used for defining the data bus of the memory;
   a parameter of memory page size used for defining a data size when the memory accesses the data; and
   a parameter of logic gate mode used for defining the logic gate type of the memory as NAND or AND.

5. The method according to claim 4, wherein the basic configuration further comprises a parameter of memory operating voltage used for defining an operating voltage of the memory.

6. The method according to claim 1, wherein the detail configuration comprises a read cycle parameter, a write cycle parameter and a parameter of actual memory capacity.

7. The method according to claim 1, wherein the parameter definition pin is a strapping pin of an initial state.

8. The method according to claim 1, wherein the parameter definition pin complies with general purpose input output (GPIO) specification.

9. A memory apparatus comprising:
a memory used for accessing data; and
a memory controller used for controlling the memory, the memory controller comprising:
   a parameter definition pin, wherein a basic configuration of the memory is defined according to the voltage level of the parameter definition pin and the memory controller performs a fundamental access operation on the memory according to the basic configuration when the memory apparatus is in a reset mode;
wherein a detail configuration of the memory a received from the memory when the memory controller fundamentally access the memory, and the memory controller drives the memory according to the basic configuration and the detail configuration.

10. The apparatus according to claim 9, wherein the memory is a flash memory.

11. The apparatus according to claim 9, wherein the memory comprises a specific data block used for storing the detail configuration of the memory.

12. The apparatus according to claim 9, wherein the basic configuration of the memory comprises:
   a parameter of data bus used for defining the data bus of the memory;
   a parameter of page size used for defining a data size when the memory accesses the data; and
   a parameter of logic gate mode used for defining the logic gate mode of the memory as NAND or AND.

13. The apparatus according to claim 12, wherein the basic configuration further comprises a parameter of memory operating voltage used for defining an operating voltage of the memory.

14. The apparatus according to claim 9, wherein the detail configuration comprises a read cycle parameter, a write cycle parameter, and a parameter of actual memory capacity.

15. The apparatus according to claim 9, wherein the parameter definition pin is a strapping pin of an initial state.

16. The apparatus according to claim 9, wherein the parameter definition pin complies with general purpose input output (GPIO) specification.

* * * * *

UNITED STATES PATENT AND TRADEMARK OFFICE
CERTIFICATE OF CORRECTION

PATENT NO. : 7,215,578 B2 Page 1 of 1
APPLICATION NO. : 11/336509
DATED : May 8, 2007
INVENTOR(S) : Chin-Yi Chiang et al.

It is certified that error appears in the above-identified patent and that said Letters Patent is hereby corrected as shown below:

On the Title page of the patent:

Item (73) - delete the Assignee name "Via Technology, Inc., Taipei (TW)" and replace with --VIA Technologies, Inc., Taipei (TW)--

Signed and Sealed this

Third Day of July, 2007

JON W. DUDAS
*Director of the United States Patent and Trademark Office*